United States Patent
Grimard et al.

[11] Patent Number: 5,903,428
[45] Date of Patent: May 11, 1999

[54] HYBRID JOHNSEN-RAHBEK ELECTROSTATIC CHUCK HAVING HIGHLY RESISTIVE MESAS SEPARATING THE CHUCK FROM A WAFER SUPPORTED THEREUPON AND METHOD OF FABRICATING SAME

[75] Inventors: Dennis S. Grimard, Ann Arbor, Mich.; Vijay Parkhe, Sunnyvale, Calif.; Hyman Levinstein, Berkeley Heights, N.J.; Fusen Chen, Cupertino; Michael G. Chafin, San Jose, both of Calif.

[73] Assignee: Applied Materials, Inc., Santa Clara, Calif.

[21] Appl. No.: 08/937,714

[22] Filed: Sep. 25, 1997

[51] Int. Cl.⁶ ..................................................... H02N 13/00
[52] U.S. Cl. ............................................. 361/234; 279/128
[58] Field of Search .................................... 361/230, 233, 361/234; 279/128; 269/8, 903

[56] References Cited

U.S. PATENT DOCUMENTS

| | | | |
|---|---|---|---|
| 4,551,192 | 11/1985 | Di Millia et al. ...................... | 156/345 |
| 5,117,121 | 5/1992 | Watanabe et al. ...................... | 361/234 |
| 5,463,526 | 10/1995 | Mundt ...................................... | 361/234 |
| 5,522,131 | 6/1996 | Steger ...................................... | 361/234 |
| 5,530,616 | 6/1996 | Kitabayashi et al. .................... | 361/234 |
| 5,583,736 | 12/1996 | Anderson et al. ....................... | 361/234 |
| 5,656,093 | 8/1997 | Burkhart et al. ........................ | 361/234 |

*Primary Examiner*—Fritz Fleming
*Attorney, Agent, or Firm*—Thomason and Moser

[57] ABSTRACT

A hybrid Johnsen-Rahbek chuck that provides a combination of both Coulombic and Johnsen-Rahbek chucking mechanisms. More specifically, the chuck contains a plurality of dielectric mesas deposited upon particular regions of the support surface of a chuck. The body of the chuck is generally fabricated from a Johnsen-Rahbek semiconducting dielectric. The mesas are formed from a thin film deposition of a highly-resistive dielectric. Consequently, the thin, highly resistive film prevents excess DC standby current as well as reduces the dependence of the electrostatic chuck performance on the wafer backside morphology and composition.

19 Claims, 5 Drawing Sheets

HYBRID JOHNSEN-RAHBEK ELECTROSTATIC CHUCK HAVING HIGHLY RESISTIVE MESAS SEPARATING THE CHUCK FROM A WAFER SUPPORTED THEREUPON AND METHOD OF FABRICATING SAME

BACKGROUND OF THE DISCLOSURE

1. Field of the Invention

The invention relates to a substrate support chuck for supporting a workpiece, such as a semiconductor wafer, within a semiconductor wafer processing system. More particularly, the invention relates to a hybrid Johnsen-Rahbek electrostatic chuck for electrostatically clamping a semiconductor wafer to the surface of the chuck during processing of the wafer.

2. Description of the Background Art

Substrate support chucks are widely used to support substrates within semiconductor wafer processing systems. A particular type of chuck used in semiconductor wafer processing systems, such as physical vapor deposition (PVD), amongst other processing systems, is a ceramic electrostatic chuck. These chucks are used to retain semiconductor wafers, or other workpieces, in a stationary position during processing. Such electrostatic chucks contain one or more electrodes embedded within a ceramic chuck body. The ceramic material is typically aluminum nitride or alumina doped with metal oxide such as titanium oxide ($TiO_2$) or some other ceramic material with similar resistive properties. This form of ceramic is partially conductive, i.e., the material has a relatively low resistivity (e.g., $10^{10}$ ohms-centimeter) at a particular operating temperature.

In use, a wafer rests flush against the surface of the chuck body as a chucking voltage is applied to the electrodes. Because of the conductive nature of the ceramic material, charges migrate through the ceramic material and accumulate proximate contact points between the wafer and the surface of the chuck body. Consequently, the wafer is primarily retained upon the chuck by the Johnsen-Rahbek effect. Such a Johnsen-Rahbek chuck is disclosed in U.S. Pat. No. 5,117,121 issued May 26, 1992 and U.S. Pat. No. 5,463,526 issued Oct. 31, 1995.

One disadvantage of using a Johnsen-Rahbek chuck is that a uniform chucking force depends upon a uniform distribution of contact points between the backside of the semiconductor wafer and the chuck surface. Since the contact point distribution varies from wafer to wafer, similar wafers are not chucked in the same manner. Furthermore, wafer backside materials may vary and consequently cause differences in the chucking force across the wafer as well as from wafer to wafer. As such, the magnitude of the chucking force and its uniformity depends on wafer backside morphology and wafer backside composition.

Therefore, a need exists in the art for an apparatus that reduces the chucking force dependence upon wafer backside morphology and composition.

SUMMARY OF THE INVENTION

The disadvantages of the prior art are overcome by the present invention of a hybrid Johnsen-Rahbek chuck that provides a combination of Coulombic and Johnsen-Rahbek chucking mechanisms to retain a workpiece such as a semiconductor wafer upon a surface of the chuck. More specifically, the invention is a plurality of dielectric mesas deposited upon, and uniformly distributed across, the support surface of an electrostatic chuck. The body of the chuck is generally fabricated from a ceramic material that facilitates the Johnsen-Rahbek effect, e.g., aluminum-nitride. In a first embodiment of the invention, the mesas are formed as individual pads from a thin film deposition of a highly resistive dielectric. As such, when the chuck is operating, charges migrate to the surface of the chuck body proximate the locations of the mesas. Thus, the Johnsen-Rahbek effect promotes charge migration, while the electrostatic force that ultimately retains the wafer atop the chuck is the Coulombic force between the charges on the surface of the chuck body beneath each mesa and the charge on the backside of the wafer above each mesa. The highly resistive mesas prevent excess DC standby current from flowing between the wafer and the chuck body. Since the mesas can be judiciously positioned to produce a uniform charge distribution across the backside of the wafer, the present invention reduces the dependence of the electrostatic chuck performance on the wafer backside morphology and composition.

More specifically; the mesas maintain a wafer, or other workpiece, in a spaced-apart relation relative to the support surface of the chuck body. The distance between the underside surface of the wafer and the chuck body is defined by the thickness of the mesas. The mesas are formed by depositing, for example, using a physical vapor deposition (PVD) process, dielectric-material on the support surface of a ceramic chuck body. The dielectric films used to form the mesas include, but are not limited to: $Si_3N_4$, $SiO_2$, $Al_2O_3$, $Ta_2O_5$, SiC and polyimide.

The mesas are approximately 5 to 350 microns thick.

Furthermore, the mesas are "sculpted" to provide a well defined support structure for the wafer. As such, the mesas are formed in such a manner to provide an optimal (e.g., minimal) contact to the backside of the wafer. In particular, the mesas are formed with either a concave or convex wafer support surface.

In one alternative embodiment of the invention, rather than depositing the mesas directly onto a planar surface of the chuck body, the chuck body is patterned and the dielectric mesa material is deposited onto the patterned chuck body to an approximate thickness of 5–50 um. In this embodiment, each mesa contains a raised portion of the surface of the chuck body having a cap of dielectric material. Specifically, the mesas are fabricated by glass beading a pattern into the ceramic chuck body (i.e., to form a plurality of raised portions above the general surface of the patterned chuck body), depositing a layer of photo-resist over the patterned chuck body, patterning the photo-resist, then PVD depositing dielectric material over the photo-resist, and lastly, removing the photo-resist to leave dielectric material atop each raised portion. As such, the mesas have two components: a raised ceramic portion and a dielectric material cap. The cap may cover the entire top surface of the raised ceramic portion or the cap may be a relatively small "dot" atop the raised ceramic portion. During use, charge migration occurs into the raised portions to enhance the chucking force at each mesa location.

Using the invention provides substantial charge migration through the ceramic (i.e., the Johnsen-Rahbek effect) but, due to the dielectric mesa, the charges do not conduct through the wafer. As such, a substantial charge accumulation occurs proximate each mesa along with a requisite improvement in chucking force magnitude and uniformity.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
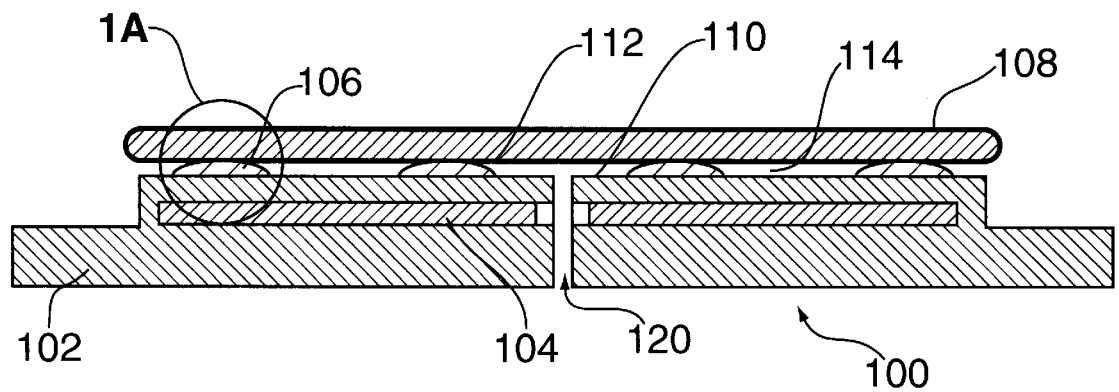
FIG. 1 depicts a vertical cross-sectional view of a first embodiment of a hybrid Johnsen-Rahbek electrostatic chuck of the present invention taken along line 1—1 of FIG. 2.
Figure 1A:
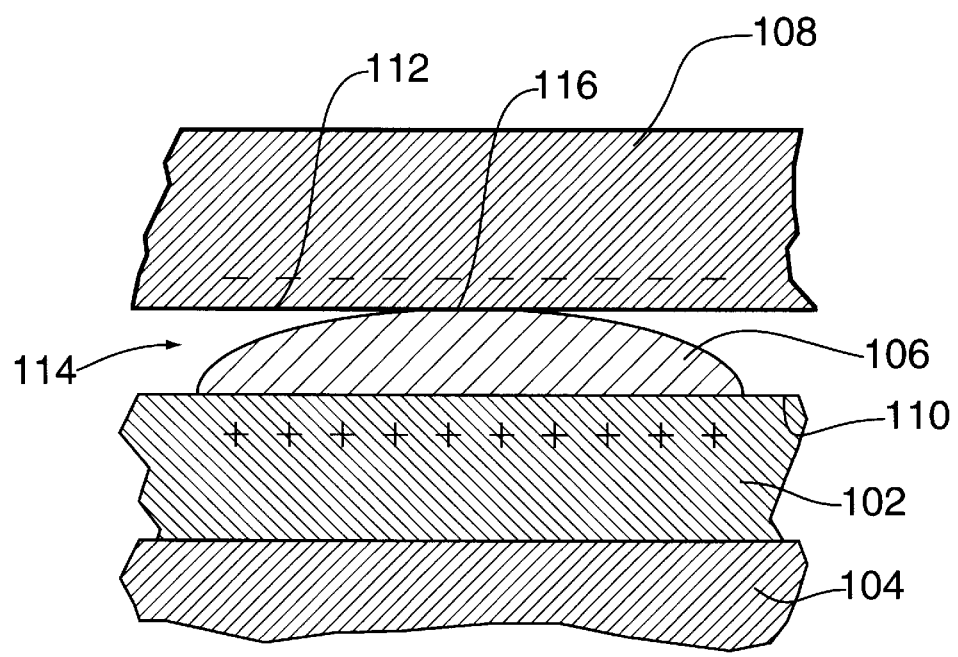
FIG. 1A provides a detailed cross-sectional view of region 1A of FIG. 1.
Figure 2:
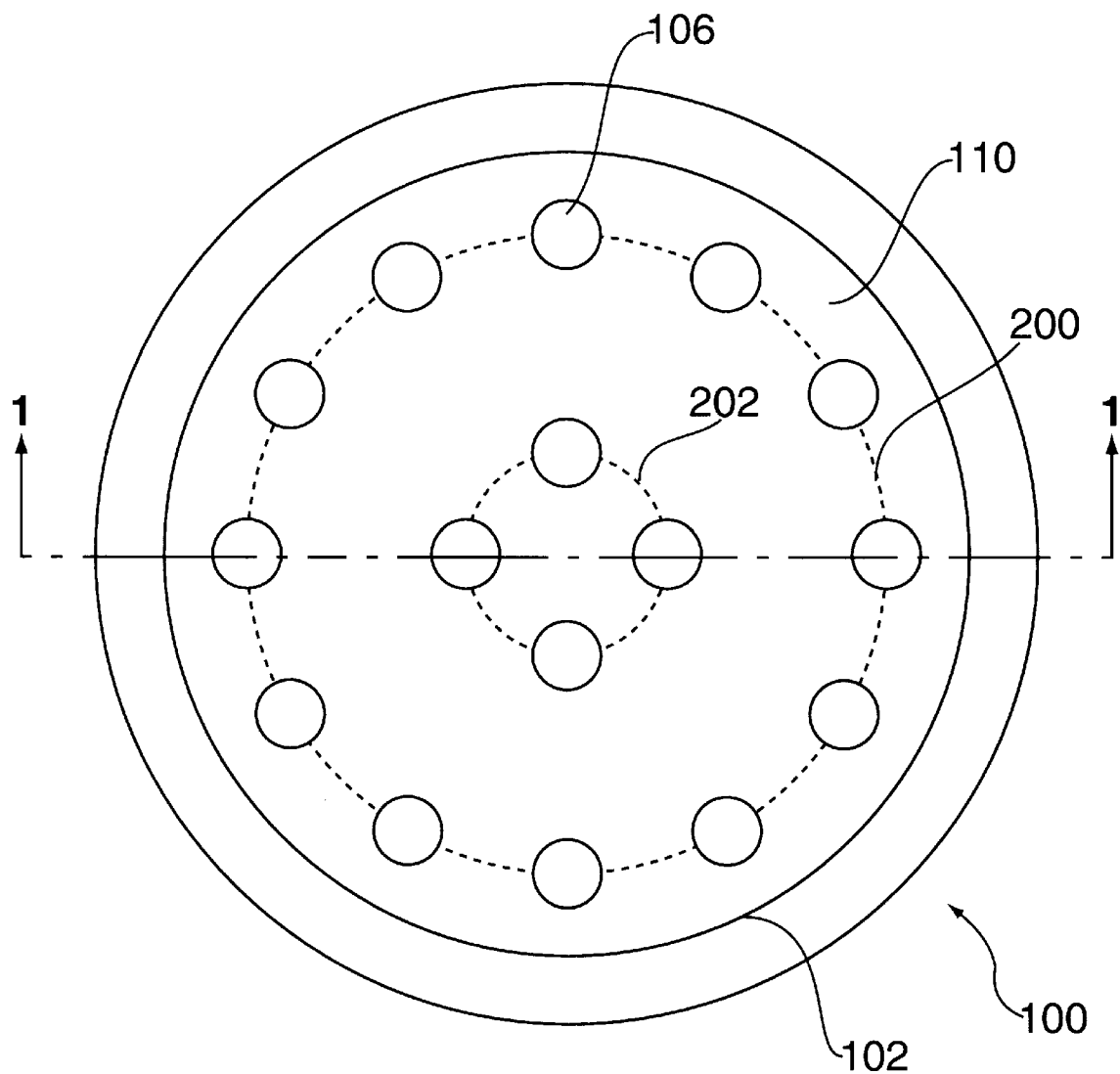
FIG. 2 depicts a top plan view of an illustrative pattern for the wafer support mesas of the present invention.

FIG. 1 depicts a vertical cross-sectional view of a first embodiment of a hybrid Johnsen-Rahbek electrostatic chuck 100 of the present invention and FIG. 1A depicts a detailed cross-section of region 1A of FIG. 1. To illustrate the use of the invention, FIG. 1 depicts a plurality of wafer support mesas 106 on the surface 110 of the chuck body 102 supporting a semiconductor wafer 108. FIG. 2 depicts a top plan view of the hybrid Johnsen-Rahbek electrostatic chuck 100 of FIG. 1 (without the wafer 108). For best understanding of the invention, the reader should refer to FIGS. 1, 1A, and 2 while reading the following disclosure.

In the first embodiment, the Johnsen-Rahbek electrostatic chuck 100 contains one or more electrodes 104 embedded within a ceramic chuck body 102. The electrode structure could be of any type, positioned anywhere in a range of, for example, 150 to 1000 micrometers beneath the support surface 110 of the chuck body 102. Typical electrode structures include, but are not limited to, a pair of coplanar D-shaped electrodes, coplanar interdigital electrodes, a plurality of coaxial annular electrodes, or a singular, circular electrode. FIG. 1 illustratively depicts a single, circular electrode 104, i.e., a monopolar electrostatic chuck electrode.

The ceramic chuck body 102 is, for example, fabricated of aluminum-nitride or doped boron-nitride. Such ceramic materials have relatively low resistivity (e.g., $10^{10}$ ohms-centimeter) and, as such, these materials promote the Johnsen-Rahbek effect. Other partially conductive ceramics also form useful Johnsen-Rahbek chuck materials including such materials as alumina doped with titanium oxide or chromium oxide.

To promote a uniform temperature across a wafer that is retained by the electrostatic chuck, a heat trasfer medium (e.g., helium or argon) is introduced to a space 114 between the chuck surface 110 and the backside surface 112 of the wafer 108. The gas is generally applied to the space 114 through one or more conduits 120 formed through the chuck body 102. The use of a "backside gas" to promote heat transfer is well known in the art.

In the first embodiment of the invention, the support surface 110 of the chuck body 102 is planar and a plurality of mesas 106 are formed atop the support surface 110. The mesas are formed from one or more layers of a high resistivity dielectric material (e.g., $10^{15}$ ohms-centimeter) such as, but not limited to: $Si_3N_4$, $SiO_2$, $Al_2O_3$, $Ta_2O_5$, SiC and polyimide. The mesas are generally formed using a conventional photo-resist lift-off technique, where a pattern of photo-resist is applied to the surface 110 and the mesa material is deposited over the photo-resist pattern. The photo-resist is then "lifted off" the surface leaving behind a pattern of mesas 106. The deposition process depends upon the dielectric material being deposited; however, generally the deposition process is either a physical vapor deposition (PVD) process or an evaporation deposition process. Also, an alternative to using the lift-off technique is to use a shadow mask technique to pattern the deposition.

The mesas 106 are generally circular in plan form having a diameter of approximately 0.5 to 3 mm. An illustrative thickness (height) of each mesa is 5 to 350 microns.

The mesas 106 are generally arranged in spaced apart, concentric rings (shown as dashed lines 200 and 202). Although other patterns may be used, such as a "star" pattern where the mesas are aligned along radials, a uniform distribution of mesas, and the like. Generally speaking, the number, spacing, size and overall pattern of the mesas is determined by the amount of clamping force applied to the wafer by the electrostatic chuck 100. For example, if the amount of force is large and the mesas 106 are spaced relatively distant from one another, the wafer 108 may bow between the mesas 106 and touch the surface 110 of the chuck body 102. On the other hand, placing too many mesas 106 on the surface 110 of the chuck body 102 could interfere with the distribution of the backside gas and the uniformity of the clamping force. Therefore, the mesas 106 must be judiciously positioned to optimize support yet limit their interference with the clamping force.

Since the ceramic chuck body 102 is partially conductive due to the relatively low resistivity of the ceramic, charges migrate from the electrode 104 to the surface 110 of the chuck body 102. Similarly, charges migrate through the wafer 108 and accumulate on the backside 112 of the wafer 108. There is no current flow through the mesa. Since each of the mesas 106 has a significantly higher resistivity than the chuck body 102, the migrating charges accumulate proximate each of the mesas 106 and the surface of the chuck. Although charges also migrate to the surface between mesas, the dielectric constant of the mesa is substantially greater than the vacuum (or dielectric constant of the mesa is substantially greater than the vacuum (or backside gas) within the gap between the backside of the wafer and the chuck body surface which results in the electric field being substantially greater at each mesa than at locations outside of a mesa. Consequently, the clamping force is greatest at each mesa 106 and the invention enables the clamping force to be strictly controlled by placement of the mesas to achieve a uniform charge distribution across the backside of the wafer.

Furthermore, the mesas 106 can be "sculpted" to provide an optimal contact surface upon which to support the wafer, i.e., the contact points can be made very repeatable, uniformly distributed and minimal in area. As shown in FIG. 1A, the dielectric layer is formed to have a convex cross-section to support the wafer with only an apex point 116. Other shapes, e.g., concave, triangular, and the like, may be useful for various applications. Additionally, the height of each of the mesas 106 can be varied with position beneath the wafer, e.g., greater spacing between the wafer and chuck body surface near the center of the chuck and less spacing near the edge of the chuck or vice versa. Such variation may compensate for wafer warping, provide a contour to the electric fields that clamp the wafer, and/or control the flow of backside gas within the space 114. Wafer cooling by applying a heat transfer gas between the wafer and the chuck body is well known in the art. However, sculpting the mesa shape and height may facilitate gas flow control beneath the wafer 108 by channeling the gas to particular regions of the wafer 108 and/or tailoring the clamping force to achieve contoured thermal conduction from the wafer 108 to the chuck body 102.

Figure 3:
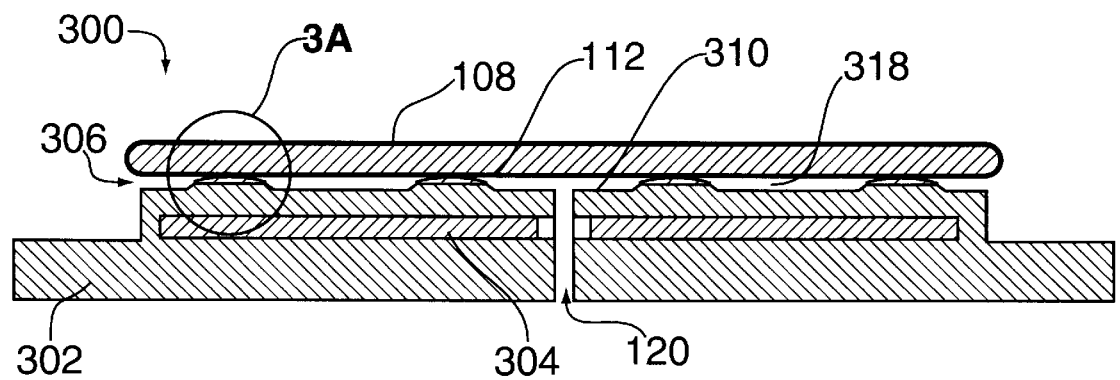
FIG. 3 depicts a vertical cross-sectional view of a second embodiment of the hybrid Johnsen-Rahbek electrostatic chuck of the present invention.
Figure 3A:
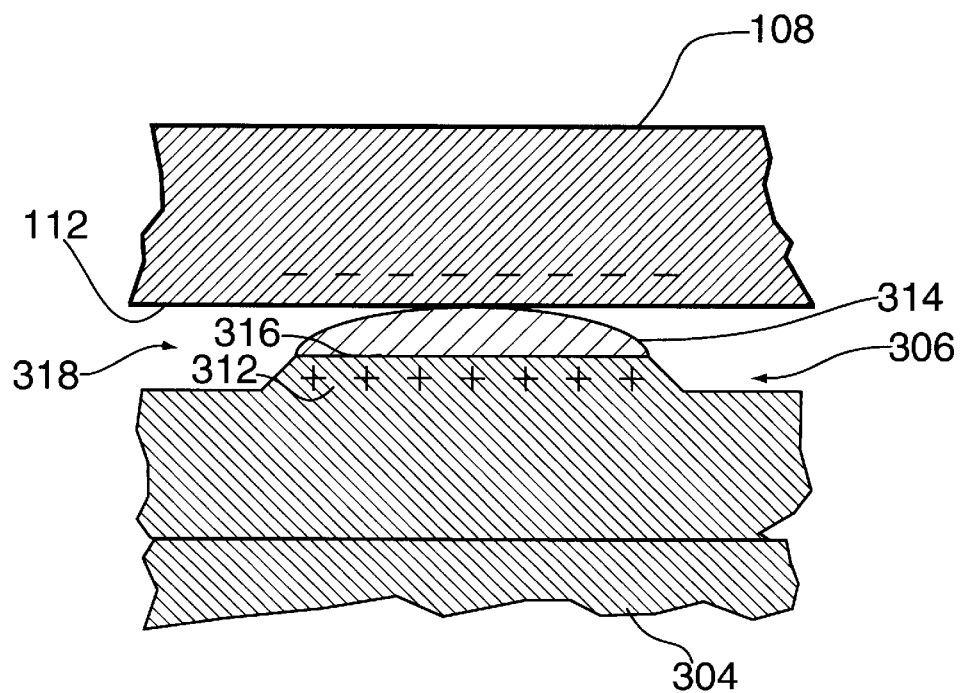
FIG. 3A provides a detailed cross-sectional view of region 3A of FIG. 3.

FIG. 3 depicts a cross-sectional view of a second embodiment of the present invention and FIG. 3A depicts a detailed cross-sectional view of region 3A of FIG. 3. To best understand this embodiment of the invention, the reader should refer simultaneously to FIGS. 3 and 3A.

In the second embodiment of the hybrid Johnsen-Rahbek chuck 300, the chuck body 302 is a ceramic material that facilitates the Johnsen-Rahbek effect and contains a electrode similar to the first embodiment of the invention. However, this embodiment contains a plurality of mesas 306 containing two components 312 and 314. The first component is a raised portion 312 of the surface 310 of the chuck body 302 and the second portion is a dielectric cap 314 positioned atop the raised portion 312.

The wafer support mesas 306 of the second embodiment are formed by first patterning the surface 310 of the ceramic body 302. Such patterning can be accomplished by bead blasting the ceramic after it is cured or by embossing a pattern into the ceramic prior to curing, i.e., while the ceramic is "green." Various other techniques are available that will form a pattern in a ceramic material and all are considered equivalent processes to those described herein.

Once the pattern is formed in the surface 310 of the chuck body 302, a photo-resist is applied to the patterned surface of the chuck body in a particular pattern, e.g., the photo-resist covers the entire chuck body surface 310 except the top surface 316 of each raised portion 312. A layer of dielectric material is deposited (e.g., by either a PVD or CVD process) over the photo-resist pattern such that wherever the photo-resist exists the dielectric material can be removed using a conventional "lift-off" process or a conventional shadow mask process. Consequently, the dielectric material forms a well-defined cap 314 atop each raised portion 312.

The mesas 306 are generally circular in plan form having a diameter of approximately 0.5 to 3 mm. An illustrative thickness (height) of each mesa is 10 to 350 microns, where the raised portion has an approximate height of 5 to 345 microns and the cap has an approximate height of 5 to 50 microns.

In use, the cap 314 of each mesa 306 acts as a barrier to charge transfer from the surface 310 of the of the chuck body 302 to the backside of the wafer 108. In this second embodiment, the charge migrates into the raised portion 312 to facilitate a substantial increase in chucking force at each mesa location over that of the first embodiment of the invention. As with the first embodiment of the invention, the charge migrates through the chuck body 302 due to the Johnsen-Rahbek effect but does not flow to the wafer. The charge accumulates at the mesa locations where each dielectric cap 314 is located, i.e., within the raised portion 312 of each mesa 306. Additionally, charge migrates to the chuck surface between the mesas as well. Since the dielectric constant of the cap 314 is substantially greater than the vacuum (or backside gas) within the gap 318 between the backside 112 of the wafer 108 and the chuck body surface 310, the electric field is substantially greater at each mesa than at locations outside of a mesa. As such, the clamping force can be strictly controlled by placement and thickness of the mesas 306 upon the surface 310 of the chuck body 302.

As with the first embodiment of the invention, the mesas 306 of the second embodiment of the invention can be sculpted to produce a clamping force profile, limit wafer backside contact to reduce particulate contamination, control backside gas flow, and the like. However, to sculpt the mesas 306, either (or both) the top surface 316 of the raised portion 312 or the dielectric cap 314 can be contoured to achieve the desired results. If the raised portion 312 is contoured, the dielectric cap generally conformally coats the contoured surface to provide the sculpted mesa.

Figure 5:
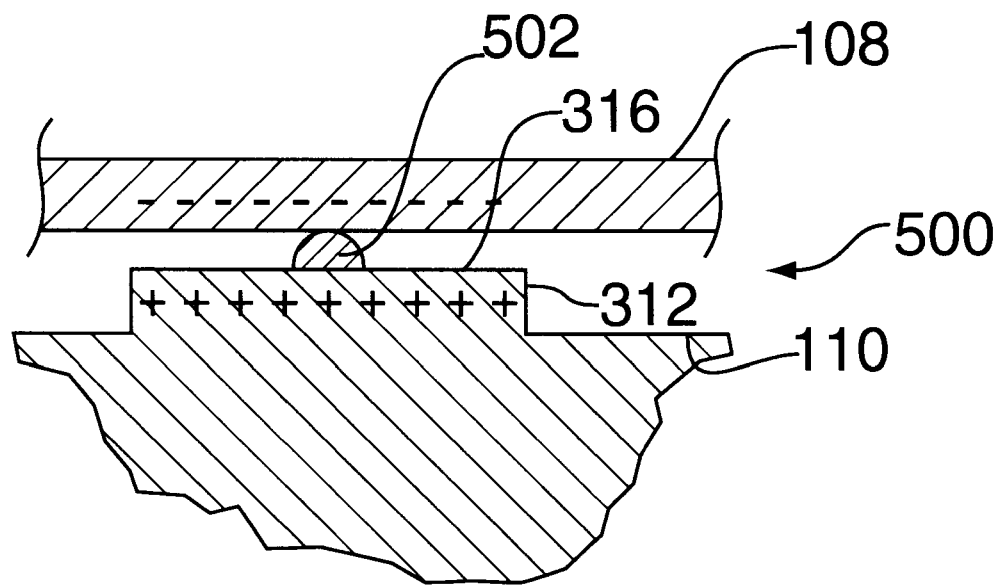
FIG. 5 depicts a cross-sectional view of an alternative embodiment of a mesa in accordance with the present invention.

FIG. 5 depicts a cross-sectional view of a third embodiment of the invention. The depicted mesa 500 is similar to the mesa in the second embodiment of the invention. However, this alternative has a cap 502 with a diameter that is substantially smaller than the diameter of the raised portion 312 of the chuck surface 110. As such, the wafer 108 is supported by a very small surface. Such an embodiment has all the benefits of the first two embodiments, as well as a limited potential for transferring contaminants from the chuck to the wafer backside and reducing wafer "sticking" upon dechucking. Additionally, the minimal contact provides a maximal amount of heat transfer gas between the wafer and chuck surface.

The principle advantage of the various embodiments of the invention is the long-term stability of the chucking performance over time. Without the mesas, decomposition products such as carbon form on the surface of the chuck body and convert the surface to a conducting surface; thereby eliminating the electric field that facilitates electrostatic wafer clamping. It is important to note that the mesas will not prevent the decomposition, but will minimize its effects on the chucking performance because, even in the face of severe decomposition, the mesa locations are unaffected and provide chucking force to retain a wafer.

Another advantage of the invention is that it is not necessary that the integrity of the highly-resistive film of each mesa be maintained at all points of contact. Thus, if any contact point (or contact points) is (are) compromised at any position on the surface of the electrostatic chuck, the effectiveness of the invention is not seriously compromised, i.e., other mesas continue to retain the wafer. In addition, since the point of any breach will never be re-established, successive wafer passes will not cause a long-term degradation of the chuck performance.

Another advantage of the present invention is that lower applied voltages may be utilized to facilitate electrostatically clamping a wafer. Since the surface potential is substantially increased at each mesa as compared to the prior art Johnsen-Rahbek electrostatic chuck, the required applied voltage is substantially decreased to similarly clamp a wafer. The increase in surface potential is due to the lowering of the electric field in the dielectric as described by the equation:

$$\vec{E} = -\nabla V \xrightarrow{t \to \infty} 0$$

which leads to a lower current density as described by the equation:

$$\vec{J} = \sigma \vec{E} \xrightarrow{t \to \infty} 0$$

and ultimately to higher surface potentials.

Other embodiments of the invention include forming the mesas from the same material as the chuck body and then coating the mesas with the highly-insulating dielectric film. Additionally, the mesa may be coated as well as the exposed surface of the electrostatic chuck body. The mesas may also be formed out of different materials from either the dielectric film or the electrostatic chuck body. For example, the mesas may be fabricated of metal deposited upon the surface of the electrostatic chuck and then coated with the dielectric film. As such, charges will migrate through the semiconducting chuck body to the metallic mesas and stop just beneath the wafer contact point within the metallic mesa. As such, a very high electrostatic field will be generated across the film from the wafer to the metallic mesa.

No matter which embodiment of the invention is used, the hybrid Johnsen-Rahbek chuck of the present invention clamps a wafer through both Coulombic and Johnsen-Rahbek chucking forces. A uniform chucking force is attained without dependence on wafer backside morphology and/or composition.

Figure 4:
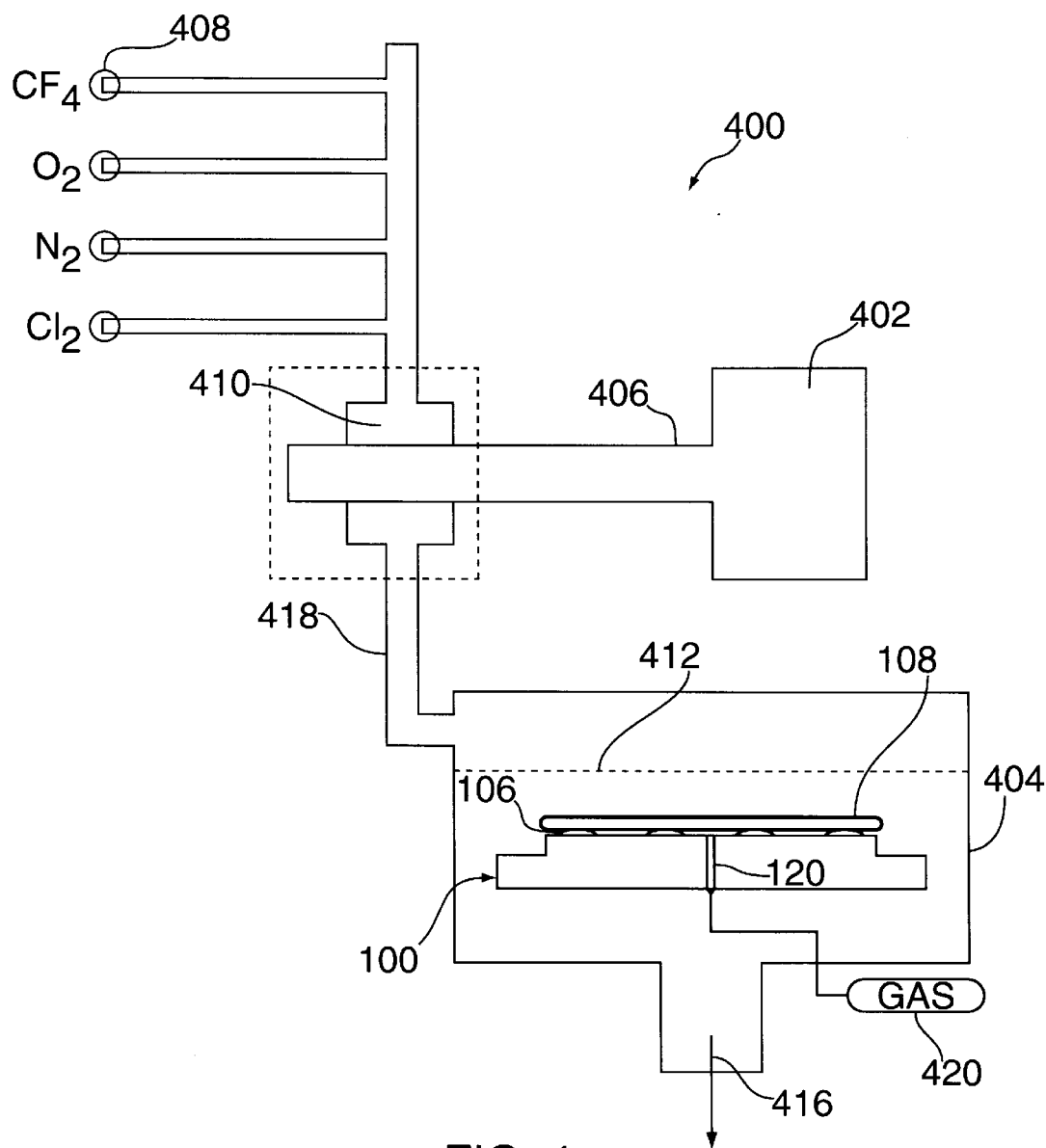
FIG. 4 depicts an application for the hybrid Johnsen-Rahbek electrostatic chuck within a remote plasma source (RPS) wafer processing system.

FIG. 4 depicts one particular use for the inventive hybrid electrostatic chuck 100 (or 300) to clamp a wafer within remote plasma source (RPS) semiconductor wafer processing system 400. The plasma processing environment includes a process chamber 404 and an applicator 410 that is used to generate a remote plasma. Some state of the art plasma applicators 410 comprise a tube, open at least one end, through which a process gas is pumped. The process gas is supplied from a source 408 and may comprise such gases as $CF_2$, $O_2$, $N_2$, $Cl_2$, and $NF_3$. A waveguide 406 is also provided through which a source of electromagnetic energy 402, such as an RF signal or a microwave signal, is directed to the tube to strike and maintain a plasma within the tube.

Reactive species produced by the plasma thus generated are directed out of the open end of the tube through a transport conduit 418. The reactive species are directed to the process chamber 404. A gas diffusion plate 412 is typically used to spread the plasma to provide an even distribution of the reactive species within the process chamber 404, thereby promoting uniform wafer processing. The reactive species are directed towards a workpiece, typically a semiconductor wafer 108, that is electrostatically retained within the chamber 404 by the hybrid Johnsen-Rahbek electrostatic chuck 100 (or 300). The reactive species are exhausted from the process chamber through an exhaust port 416. To promote uniform temperature gradients across the wafer during processing, a backside gas is optionally provided from source 420 through conduit 120 to the space 114 between the wafer 108 and the chuck 100. The mesas 106 (or 306) can be positioned to channel the backside gas to facilitate a uniform temperature across the wafer or to produce a particular temperature gradient across the wafer.

The Johnsen-Rahbek chuck 100 (or 300) provides uniform clamping force without concern for the backside morphology of the wafer. Such uniform clamping force facilitates uniform temperature gradients across the wafer and improved wafer processing within an RPS system. In short, the present invention brings the various advantages mentioned above to semiconductor processing systems and, in particular, to RPS systems.

Although various embodiments which incorporate the teachings of the present invention have been shown and described in detail herein, those skilled in the art can readily devise many other varied embodiments that still incorporate these teachings.

What is claimed is:

1. Apparatus for supporting a workpiece in a spaced-apart relation to a support surface of a workpiece support chuck, comprising:

a chuck body fabricated of a relatively low resistivity material having a support surface; and a plurality of individual mesas located upon the support surface of the chuck body wherein each mesa in said plurality of mesas comprises a raised portion of said chuck body that rises above said support surface and a cap, fabricated from a high resistivity dielectric, deposited upon a top surface of the raised portion, said cap having an arcuate profile that minimizes the area of contact between the workpiece and the cap.

2. The apparatus of claim 1 wherein said chuck body further comprises:

at least one electrode embedded beneath said support surface.

3. The apparatus of claim 1 wherein said cap on each of said plurality of mesas is fabricated of one or more of the materials selected from $Si_3N_4$, $SiO_2$, $Al_2O_3$, $Ta_2O_5$, SiC and polyimide.

4. The apparatus of claim 1 wherein said plurality of mesas are formed in a predefined pattern deposited atop said support surface.

5. The apparatus of claim 1 wherein a diameter of said cap is smaller than a diameter at said raised portion of said chuck body.

6. The apparatus of claim 1 wherein a top surface of each of the plurality of mesas is sculpted.

7. The apparatus of claim 6 wherein the cap is convex or concave.

8. The apparatus of claim 1 wherein said plurality of mesas is varied in height to achieve a particular clamping force contour.

9. The apparatus of claim 1 further comprising:

a conduit for supplying a heat transfer medium to the support surface of the chuck body, where said plurality of mesas are positioned upon the support surface of the chuck body to facilitate distribution of the heat transfer medium over the support surface of the chuck body.

10. A system for processing semiconductor wafers comprising:

a process chamber;

a wafer support pedestal, positioned within said process chamber, for supporting a wafer for processing within said process chamber, where said wafer support pedestal comprises a chuck body fabricated of a relatively low resistivity material having a support surface and a plurality of individual mesas located upon the support surface of the chuck body to maintain said wafer in a spaced-apart relation to said chuck body, wherein each mesa in said plurality of mesas comprises a raised portion of said chuck body that raises above said support surface and a cap, fabricated from a high resistivity dielectric, deposited upon a top surface of the raised portion, said cap having a arcuate profile that minimizes the area of contact between the workpiece and the cap.

11. The system of claim 10 further comprising a plasma source for generating a plasma for processing the wafer.

12. The system of claim 11 wherein said plasma source is remotely located with respect to the process chamber and coupled to the process chamber via a transport conduit.

13. The system of claim 12 further comprising:

a source of a heat transfer medium coupled to said support surface of said chuck body, where said plurality of mesas are positioned upon the support surface of the chuck body to facilitate distribution of said heat transfer medium across the support surface of said chuck body.

14. A method of fabricating a hybrid Johnsen-Rahbek chuck comprising the steps of:

provide a chuck body having a support surface;

patterning said support surface to form a plurality of raised portions, each having a top surface; and depositing a high resistivity dielectric layer upon each top surface of each raised portion to form a dielectric cap, having an arcuate profile that minimizes the area of contact between a workpiece and the cap.

15. The method of claim 14 wherein said patterning step further comprises the step of bead blasting the support surface.

16. The method of claim 14 wherein said patterning step further comprises the step of embossing the support surface.

17. The method of claim 14 wherein said depositing step further comprises the steps of:

depositing a layer of photo-resist over the patterned support surface of the chuck body;

patterning the photo-resist layer to expose the top surface of each of the raised portions;

depositing a layer of highly-resistive dielectric material over the patterned photo-resist layer; and removing the dielectric material that is not located on the top surface of the raised portions.

18. The method of claim 14 wherein said depositing step further comprises a step of PVD depositing said high resistivity dielectric material.

19. The method of claim wherein said depositing step further comprises a step of CVD depositing said high resistivity dielectric material.

* * * * *